(12) United States Patent
Vierthaler et al.

(10) Patent No.: US 7,317,800 B1
(45) Date of Patent: Jan. 8, 2008

(54) APPARATUS AND METHOD FOR PROCESSING AN AUDIO SIGNAL TO COMPENSATE FOR THE FREQUENCY RESPONSE OF LOUDSPEAKERS

(75) Inventors: Matthias Vierthaler, Freiburg (DE); Martin Winterer, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 10/030,521

(22) PCT Filed: May 26, 2000

(86) PCT No.: PCT/EP00/04798

§ 371 (c)(1),
(2), (4) Date: May 10, 2002

(87) PCT Pub. No.: WO01/01566

PCT Pub. Date: Jan. 4, 2001

(30) Foreign Application Priority Data

Jun. 23, 1999 (DE) .................................. 199 28 420

(51) Int. Cl.
*H03G 3/00* (2006.01)
*H03G 5/00* (2006.01)

(52) U.S. Cl. .................. 381/61; 381/104; 381/106; 381/107; 381/98

(58) Field of Classification Search ............... 381/104, 381/1.07, 109, 98, 61, 93, 83, 318, 106, 95, 381/96, 1
See application file for complete search history.

(56) References Cited

U.S. PATENT DOCUMENTS

| 4,000,370 | A | * | 12/1976 | Smith et al. ............... 381/104 |
| 4,150,253 | A | | 4/1979 | Knoppel |
| 4,182,930 | A | * | 1/1980 | Blackmer ................... 381/28 |
| 4,696,044 | A | * | 9/1987 | Waller, Jr. ................. 381/106 |
| 4,700,390 | A | | 10/1987 | Machida |
| 4,739,514 | A | | 4/1988 | Short et al. |
| 4,790,014 | A | * | 12/1988 | Watanabe et al. ............. 381/1 |
| 5,305,388 | A | | 4/1994 | Konno |
| 5,359,665 | A | | 10/1994 | Werbach |
| 5,369,711 | A | * | 11/1994 | Williamson ................ 381/104 |
| 5,668,885 | A | | 9/1997 | Oda |
| 5,771,296 | A | | 6/1998 | Unemura |
| 6,111,960 | A | | 8/2000 | Aarts et al. ................. 381/61 |

FOREIGN PATENT DOCUMENTS

WO   WO 99264454   5/1999   .......................... 3/4

OTHER PUBLICATIONS

Japanese Patent Abstract 59-22419, Sano Shinya, "Harmonic Synthesizing Circuit," Feb. 4, 1984.

* cited by examiner

*Primary Examiner*—Vivian Chin
*Assistant Examiner*—Douglas Suthers
(74) *Attorney, Agent, or Firm*—O'Shea, Getz & Kosakowski, P.C.

(57) ABSTRACT

A circuit for processing an input audio signal received at an input of the circuit provides a processed audio signal at a circuit output. The circuit includes first and second conductive paths through which the received audio signal travels. The audio signal is processed such that harmonics of the signal components with a low-frequency are generated in the second path and are admixed to the signal in the first path. In the second path the audio signal is sequentially bandpass filtered, weighted with a correction factor, amplified, limited to a predetermined value, and bandpass filtered, where the correction factor is reduced when the predetermined value is exceeded.

20 Claims, 3 Drawing Sheets

APPARATUS AND METHOD FOR PROCESSING AN AUDIO SIGNAL TO COMPENSATE FOR THE FREQUENCY RESPONSE OF LOUDSPEAKERS

BACKGROUND OF THE INVENTION

The present invention relates generally to processing audio signals, and more particularly to a method and apparatus for processing an audio signal to compensate for the frequency response of loudspeakers.

Devices that reproduce acoustic signals such as, for example, television sets, radio receivers, and stereo systems, include a circuit for processing the audio signals. Typically, such circuits are designed to compensate for the frequency response of the loudspeakers to improve acoustic reproduction, and to prevent overdriving the device or the system.

The most critical element in a unit for acoustic reproduction is the loudspeaker. The acoustic pressure of a loudspeaker drops about 40 db per decade below a structurally determined limit frequency. This corresponds to the transfer function of a second-order filter. On the other hand, bass reflex and transmission line loudspeakers have transfer functions which correspond to a higher order filter. Their lower limit frequency typically lies between about 50 Hz and 200 Hz. The lower the limit frequency of a loudspeaker, the more expensive it is to produce. Economical units such as, for example, television or portable radio receivers consequently are equipped with simple loudspeakers that have a relatively high lower limit frequency. To improve acoustic reproduction in the lower frequency range, the limit frequency of such units is shifted downward by preamplifying the low frequencies. However, this can cause the final amplifier and the loudspeakers to be overdriven. To prevent overdriving and possibly even destruction of the final amplifier or the loudspeaker, the output signal of the bass amplifier is fed back in such a way that the amplification of the lower frequencies is reduced if the output signal is strong. One example of such an approach is disclosed in U.S. Pat. No. 5,305,388.

Another conventional approach is disclosed in U.S. Pat. No. 5,359,665. This patent describes a circuit in which the audio signal is conducted directly, via a first path, to the first input of an adder. The audio signal is simultaneously conducted, via a second path, to the second input of the adder. This second path includes a low-pass filter and an amplifier with variable amplification. The output of the amplifier is fed back, through a signal level detector, to its control input. This circuit arrangement is described in the '665 patent to have the benefit of reducing overdrive of the final amplifier.

From research results of psychoacoustics, it is known that a person can still unambiguously determine the fundamental level of a tone even when only harmonics of the fundamental frequency and not the fundamental frequency itself is present in the spectrum. This psychoacoustic effect is utilized in that the harmonic of the fundamental frequency is generated and is conducted to a loudspeaker whose limit frequency lies above this fundamental frequency. A listener consequently believes that he or she hears this low fundamental frequency even though the loudspeaker does not radiate it at all.

U.S. Pat. No. 5,668,885 describes a circuit that "entices" from a loudspeaker, having a relatively high lower limit frequency, frequencies which are lower than its limit frequency. This is done by generating harmonics of the lower frequencies. The audio signal is conducted, via a first path, to the first input of an adder. In a second path, the audio signal passes through a low-pass filter, is rectified, passes through a second low-pass filter, is amplified, and finally is conducted to the second input of the adder.

U.S. Pat. No. 4,150,253 describes a method and a circuit in which an audio signal is divided into two signal paths. In the first path, the audio signal traverses a high-pass filter, so as to shift the phase based on the frequency. Those signals at the output of the high-pass filter which are at levels that exceed a given value are conducted to the input of a generator which generates the harmonics of the fundamental frequency. The level of the signals at the output of the generator is attenuated to a value below the level of the original audio signal. This attenuated signal and the original audio signal are then added together.

U.S. Pat. No. 4,700,390 describes a synthesizer in which harmonics are generated both for the lower and higher frequencies, and are added to the original audio signal. The alleged benefit set out in the '390 patent is that this achieves better reproduction both in the low and high frequency ranges.

U.S. Pat. No. 5,771,296 describes a circuit in which the audio signal is conducted, via a first path, directly into an adder, while, via a second path, the harmonics of the lower frequencies are generated and are added in the adder to the original signal. This provides the perception to the listener that the loudspeaker radiates lower frequencies than it actually does.

U.S. Pat. No. 4,739,514 describes a circuit to improve the acoustic reproduction of low frequencies. With this circuit, the audio signal is conducted, via a first path, to the first input of an adder, while, via a second path consisting of an amplifier with variable amplification in series with a band-pass filter, it is conducted to the second input of the adder. A signal level detector, whose input receives the audio signal, controls the amplification of the amplifier.

The above and other conventional methods and circuits have the disadvantage that, due to the feedback technique employed, they react relatively slowly to rising amplitudes and, despite the feedback, they tend to overdrive the device or the system.

What is needed, therefore, is an audio processing technique that compensates for the frequency response of a loudspeaker without overdriving the circuit, its components or the entire reproduction system, particularly in the range of low frequencies.

SUMMARY OF THE INVENTION

According to an aspect of the invention, a method for processing a received audio signal includes band-limiting the received audio signal to generate a first intermediate signal. The first intermediate signal is multiplied by a correction factor to generate a second intermediate signal which is amplified by an amplification factor to generate a third intermediate signal. The amplitude of the third intermediate signal is limited to a predetermined value to generate a fourth intermediate signal. The fourth intermediate signal is band limited to generate a fifth intermediate signal which is added to the received audio signal.

In another aspect of the invention, a circuit processes an input audio signal received at an input of the circuit and provides a processed audio signal at an output of the circuit. The circuit includes a first adder having first and second inputs and an output at which the processed audio signal is provided. A first conductive path connects the input audio signal circuit input to the first input of the first adder, the first conductive path being constructed and arranged to deliver the received input audio signal unaltered to the first adder. A second conductive path connects the circuit input to the second input of the first adder after the input audio signal undergoes processing in the second conductive path. The second conductive path includes a first bandpass filter having an input connected to the input audio signal at the circuit input. A multiplier has a first input connected to the output of the first bandpass filter. A variable amplifier, having an input connected to the multiplier output, amplifies the multiplier output signal in accordance with an amplification factor presented at a control input of the variable amplifier. A first nonlinear circuit has an input connected to the amplifier output, the nonlinear circuit limited to a predetermined value of the amplitude of the amplifier output signal. A second bandpass filter has an input connected to the nonlinear circuit output and an output connected to the second input of the first adder and defining the output of the second conductive path. A first function generator has an input connected to a control output of the first nonlinear circuit, and an output connected to the second input of the multiplier.

In a further aspect of the invention, a circuit for processing an input audio signal received at an input of the circuit provides a processed audio signal at a circuit output. The circuit band-limits the received audio signal to generate a first intermediate signal, and multiplies the first intermediate signal by a correction factor to generate a second intermediate signal. The circuit also amplifies the second intermediate signal by an amplification factor to generate a third intermediate signal, and limits the amplitude of the third intermediate signal to a predetermined value to generate a fourth intermediate signal. The circuit further band-limits the fourth intermediate signal to generate a fifth intermediate signal, and adds the fifth intermediate signal to the received audio signal.

In a still further aspect of the invention, a circuit for processing an input audio signal received at an input of the circuit provides a processed audio signal at a circuit output. The circuit includes first and second conductive paths through which the received audio signal travels. The audio signal is processed such that harmonics of the signal components with a low-frequency are generated in the second path and are admixed to the signal in the first path. In the second path the audio signal is sequentially bandpass filtered, weighted with a correction factor, amplified, limited to a predetermined value, and bandpass filtered, where the correction factor is reduced when the predetermined value is exceeded.

These and other objects, features and advantages of the present invention will become more apparent in light of the following detailed description of preferred embodiments thereof, as illustrated in the accompanying drawings.

DETAILED DESCRIPTION OF THE INVENTION

The present invention is directed to an improved method and circuit for processing audio signals in a manner that compensates for the frequency response of the loudspeaker without overdriving the circuit components. Aspects of the present invention are described in detail below with reference to different embodiments of an audio processing circuit.

Figure 1:
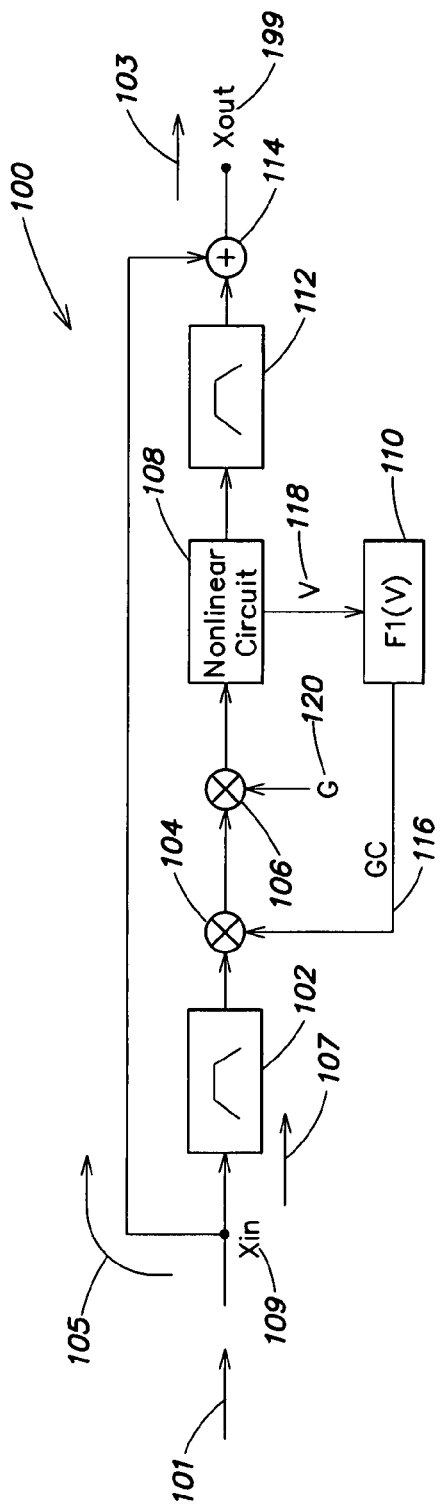
FIG. 1 is a schematic block diagram illustration of one embodiment of an audio processing circuit of the present invention.

FIG. 1 is a schematic block diagram of one embodiment of an audio processing circuit of the present invention. In FIG. 1, an audio signal 101 is received at a circuit input Xin 109. The received audio signal 101 is conducted, via a first path 105, to a first input of an adder 114 and, via a second path 107, to a second input of the adder 114. The second path 107 includes a first bandpass filter 102, a multiplier 104, an amplifier 106 with variable amplification, a nonlinear circuit 108, and a second bandpass filter 112, all connected in series. A processed audio signal 103 is available at a circuit output node Xout 199. The circuit output 199 is directly connected to the output of the adder 114. A control output of the nonlinear circuit 108 is connected to an input of a function generator 110. The nonlinear circuit 108 generates at its control output a control variable ("V") 118 which the function generator 110 uses to generate a correction factor ("GC") 116 based on the value of the control variable 118. The output of the function generator 110 is connected to the multiplier 104, providing the correction factor ("GC") 116 to the multiplier 104. As illustrated in FIG. 1, a control variable ("G") 120 is applied to a control input of the amplifier 106.

During operation, the received audio signal 101 is band-limited by the bandpass filter 102. The band-limited audio signal is then multiplied by the variable correction factor GC 116 in the multiplier 104. The resulting product provided at the output of the multiplier 104 is amplified in the amplifier 106 by the amplification factor G 120. The nonlinear circuit 108 limits the amplitude of the audio signal delivered by the amplifier 106 to a specified value. Various embodiments of the nonlinear circuit 108 are described in detail below. The output signal of the nonlinear circuit 108 is band-limited by the second bandpass filter 112. As noted, the nonlinear circuit 108 generates the control variable V 118, the value of which is used by the function generator 110 to generate the correction factor GC 116. The correction factor GC 116 is varied by the function generator 110 based on the value of the control variable 118. The value of the correction factor GC 116 is reduced by the function generator 110 when the control variable 118 is greater than a predetermined value, a condition that can result in an overdrive condition. On the other hand, if the level of the audio signal lies within allowed limits, the correction factor GC 116 is increased by the function generator 110. The value of the correction factor GC 116 may be limited to a value of one. This is described in greater detail below.

Figure 2:
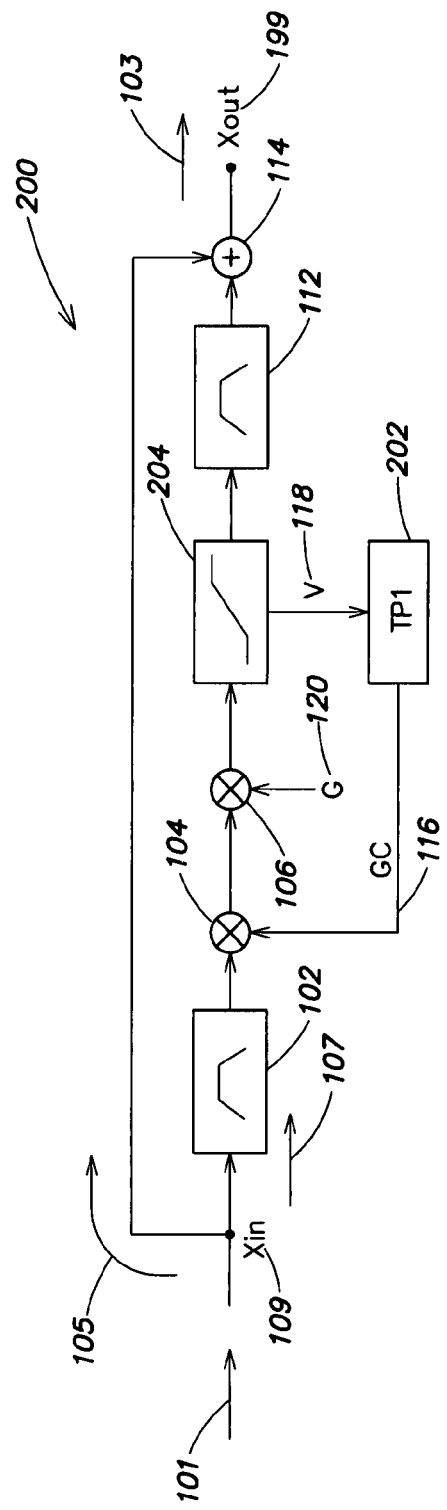
FIG. 2 is a schematic block diagram illustration of another embodiment of an audio processing circuit of the present invention.

A schematic block diagram of another embodiment of the audio processing circuit of the present invention, referred to as the audio processing circuit 200, is illustrated in FIG. 2. The audio processing circuit 200 of FIG. 2 is described in conjunction with the embodiment of the audio processing circuit 100 of FIG. 1.

As illustrated in FIG. 2, the arrangement of the components of the audio processing circuit 200 is similar to that of the audio processing circuit 100 of FIG. 1. However, in the exemplary embodiment illustrated in FIG. 2, the function generator 110 is implemented as a low-pass filter 202. Also, in this embodiment, the nonlinear circuit 108 is implemented as a limiter circuit 204 which cuts off the signal amplitude above a predetermined threshold value. It should be understood to those of ordinary skill in the art that the above-noted components of the audio processing circuits 100 and 200 can be implemented with any well-known circuit components now or later developed.

If the amplitude of the audio signal amplified by the amplifier 106 exceeds the predetermined threshold value, the nonlinear circuit 108, 204 sets the value of the control variable V 118 to a negative value. On the other hand, when the amplitude of the signal lies below the predetermined threshold value, the nonlinear circuit 108, 204 generates the control variable V 118 with a positive value. As noted, the control variable V 118 is received by the low-pass filter 202 which generates the correction factor 116 based on the value of the control variable 118. In accordance with the embodiment illustrated in FIG. 2, the correction factor GC 116 for the multiplier 104 is created by filtering the control variable V 118 by the low-pass filter 202.

The nonlinear operation in the nonlinear circuit 108, 204 which limits the amplitudes of the audio signal to a predetermined threshold value, generates audio signals with lower frequencies, which are also called harmonics of the bass signal. The shape of these harmonics is determined by the selection of the nonlinear operation implemented in the nonlinear circuit 108, 204 and by the dimensioning of the bandpass filter 112. A useful form of these harmonics can be determined, for example, by calculation or by experiment, so as to make the beginning of an audio signal with low frequencies, such as the striking of a drum, appear clearer and brighter to a listener. The choice of the function implemented in the function generator 110, 202 determines the time which passes between the beginning of a strong, low-frequency tone and the reduction of the correction factor GC 116 to such an extent that the nonlinear circuit 108, 204 no longer generates harmonics. The length of this time interval, which is regarded as a time constant, is determined by the dimensioning of the low-pass filter 202 and the choice of the positive and negative values of the control variable V 118.

One advantage of the audio processing circuits 100, 200 is that, with a small signal amplitude, the amplifier 106 operates at full amplification and thus partially compensates the frequency characteristic of a loudspeaker. On the other hand, if the signal amplitude is sufficiently large, the frequency characteristic of the loudspeaker can be slightly compensated to avoid the loudspeaker from being overdriven. Thus, upon the onset of a bass signal, the bass signal is enriched with harmonics so that a listener, despite the lack of bass volume from the loudspeaker, has the sensation of clearly and loudly hearing the bass frequencies.

Figure 3:
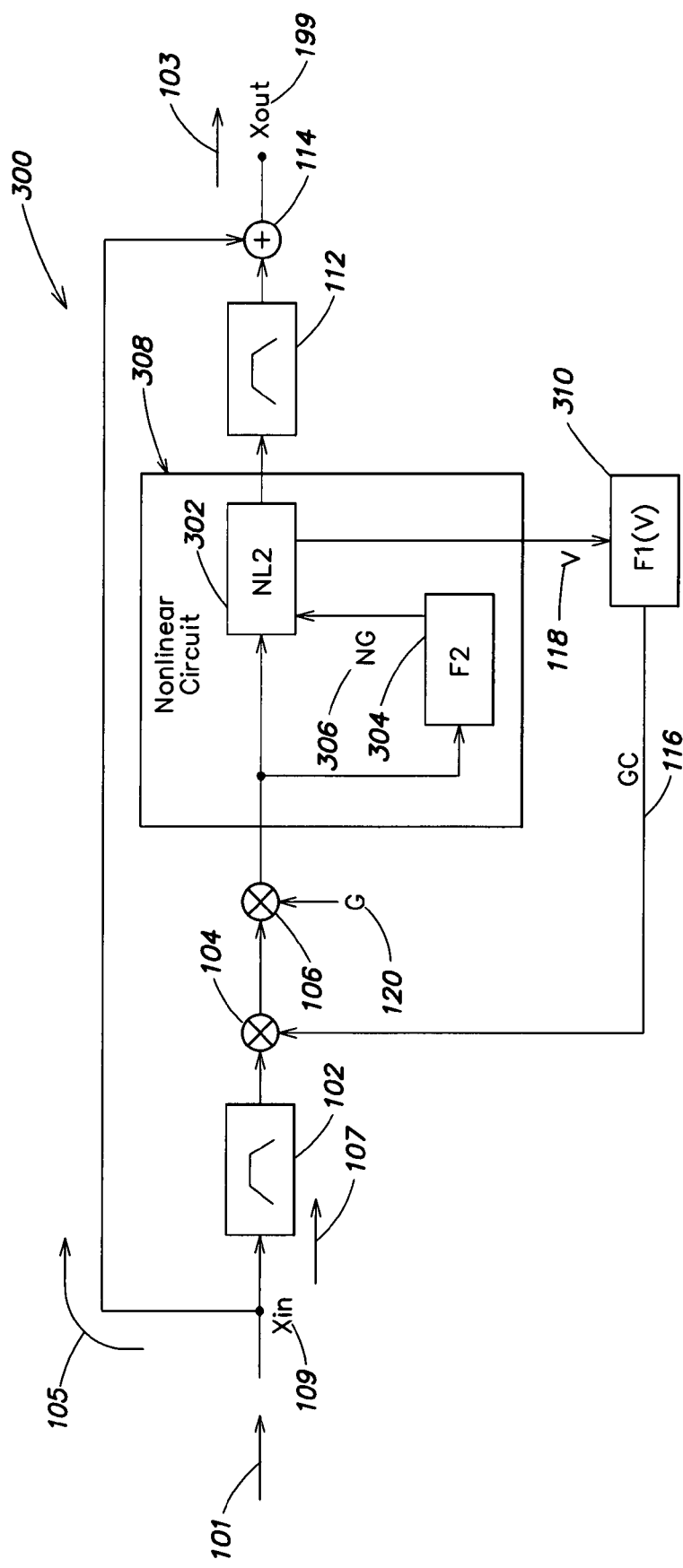
FIG. 3 is a schematic block diagram illustration of a further embodiment of an audio processing circuit of the present invention.

A further embodiment of the audio processing circuit of the present invention, referred to as the audio processing circuit 300, is illustrated in FIG. 3. The audio processing circuit 300 is described in conjunction with the embodiments of the audio processing circuits 100 and 200 of FIGS. 1 and 2, respectively.

In the exemplary embodiment illustrated in FIG. 3, a more detailed illustration of one embodiment of the nonlinear circuit 308 is shown. This embodiment of the nonlinear circuit 308 includes a second nonlinear circuit 302 and a second function generator 304. The audio signal provided to the input of the nonlinear circuit 308 is the output signal of the amplifier 106. This signal is directly conducted to the input of the second nonlinear circuit 302 and to the input of the second function generator 304. The output of the second function generator 304 is connected to a control input of the second nonlinear circuit 302. The signal output of the second nonlinear circuit 302 is connected to the input of the bandpass filter 112, while a control output of the second nonlinear circuit 302 is connected to a function generator 310. The function generator 310 can be implemented as the function generator 110 described above with reference to FIG. 1, or as the low-pass filter 210 described above with reference to FIG. 2.

The second nonlinear circuit 302 continuously generates harmonics of the low-frequency components of the audio signal, which are weighted with the variable factor ("NG") 306 by the second function generator 304. The factor NG 306 is a function of the signal input to the second function generator 304. Depending on the choice of the function for the second function generator 304, manifold acoustic effects can be created. For example, the second function generator 304 can be designed so that the second nonlinear circuit 302 more strongly generates harmonics as soon as the signal amplitude is to be limited, to prevent overdrive. In this way, signal energy is distributed among the higher frequency harmonics, which a loudspeaker or a loudspeaker system can more accurately reproduce. Although the energy of the lower frequency signal components is reduced in this approach, the listener nevertheless has the impression of a full bass sound due to the above-mentioned psychoacoustic effects.

Figure 4:
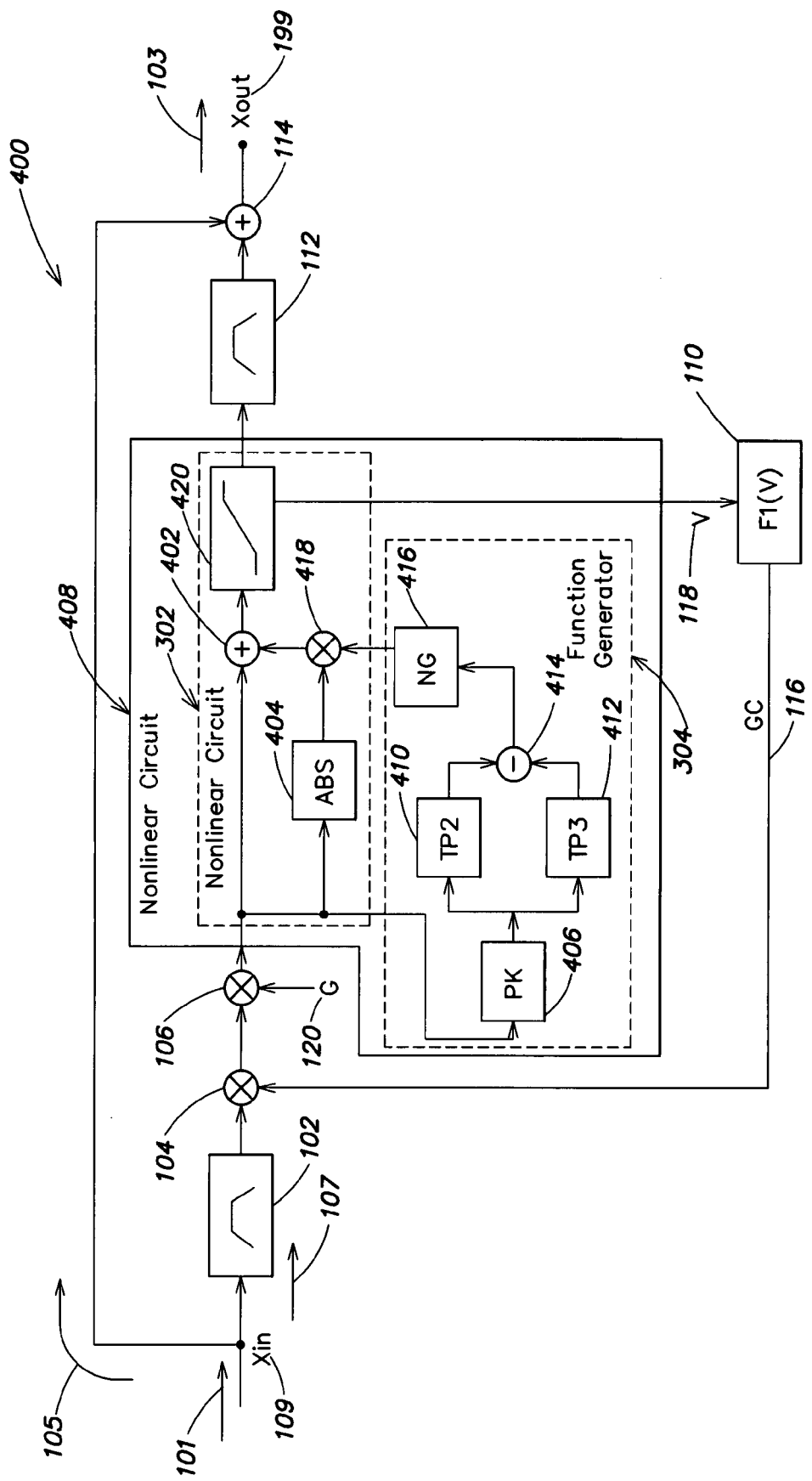
FIG. 4 is a schematic block diagram illustration of yet another embodiment of an audio processing circuit of the present invention.

A still further embodiment of the audio processing circuit of the present invention, referred to as the audio processing circuit 400, is illustrated in FIG. 4. The audio processing circuit 400 is described in conjunction with the embodiments of the audio processing circuits 100, 200 and 300 of FIGS. 1, 2 and 3, respectively. In this exemplary illustration of the audio processing circuit 400, one embodiment of a detailed implementation of the nonlinear circuit 308 of FIG. 3 is illustrated. This illustrative embodiment is referred to in FIG. 4 as nonlinear circuit 408. The nonlinear circuit 408 includes embodiments of the second nonlinear circuit 302 of FIG. 3, still referred to as the second nonlinear circuit 302 herein, and the second function generator 304 of FIG. 3, still referred to herein as the second function generator 304.

In this embodiment, the signal input to the nonlinear circuit 408, which, as noted, is the output signal from the amplifier 106, is conducted to a first input of an adder 402, to the input of an absolute value forming circuit 404, and to the input of a peak value detector 406. The output of the peak value detector 406 is connected to the input of both a first low-pass filter 410 and a second low-pass filter 412. The output of the first low-pass filter 410 is connected to a first input of a subtractor 414, and the output of the second low-pass filter 412 is connected to a second input of the subtractor 414. The output of the subtractor 414 is connected, via a limiter 416, to a first input of a multiplier 418.

The output of the absolute value forming circuit 404 is connected to the second input of the multiplier 418, the output of which is connected to a second input of the adder 402. The output of the adder 402 is connected to the input of a limiter 420. The control output of the limiter 420 is provided to the function generator 110. As with the function generator 310, the function generator 110 can be implemented as the function generator 110 of FIG. 1 or as the low-pass filter 202 of FIG. 2. The output of the limiter 420 is connected to the input of the bandpass filter 112. The processed audio signal 103 for a loudspeaker or a loudspeaker system is available at the output of the bandpass filter 112.

The peak value detector 406 determines the level of the relatively highest amplitude occurring during a specified time interval T. The output signal of the peak value detector 406 is time-averaged by the first and second low-pass filters 410, 412. In one embodiment, the time constant of the second low-pass filter 412 is smaller than that of the first low-pass filter 410. That is, the cut-off frequency of the second low-pass filter 412 with the smaller time constant is higher than that of the first low-pass filter 410 with the larger time constant. Because of the smaller time constant, the output signal of the second low-pass filter 412 follows a change of the input signal faster than does the output signal of the first low-pass filter 410. The absolute value forming circuit 404 forms the absolute value of the input signal, which is weighted in the multiplier 418 by the factor NG generated by the subtractor 414. The limiter 416 limits the factor NG to a range between zero and one. The weighted absolute value of the input signal is added in the adder 402 to the input signal, and the resulting sum is limited to a specified amplitude by the limiter 420 to prevent overdrive.

For example, if the amplitude of the input signal rises discontinuously, the level at the output of the second low-pass filter 412 will rise faster, due to its smaller time constant, than at the output of the first low-pass filter 410. As a result, the factor NG, which is to be regarded as a control variable, assumes a positive value for rising amplitudes in the input signal. As the rate at which the amplitude of the input signal rises increases, more harmonics will be generated and will be admixed to the input signal. On the other hand, if the amplitude falls, the factor NG becomes negative, because now the level at the output of the second low-pass filter 412, due to its smaller time constant, becomes smaller than the level at the output of the first low-pass filter 410. Because the factor NG has a lower limit of zero, no harmonics are admixed to the audio signal when the amplitudes are falling.

A significant advantage of the invention is that the nonlinear operation of the nonlinear circuit 408, and the function of the function generator 110, determines the form of the harmonics as well as the time of their generation. It should be understood by those of ordinary skill in the art that adjustments in the nonlinear operation of the nonlinear circuit 108, 208, 308, 408 and of the function of the function generator 110, 210, 310, the invention can easily be adapted to loudspeakers with different characteristics, so that optimum compensation of the frequency response of a loudspeaker is always achieved. Because the amplitude of the audio signal is limited to a specified value by the nonlinear circuit, the inventive circuit reacts much faster than the prior art to rising amplitudes of the audio signal.

The invention is especially suited for acoustic reproduction units, e.g. television units, portable radios, which are equipped with loudspeakers with a weak bass range, because the invention prevents overdriving the entire reproduction system and at the same time offers the listener the illusion of sonorous basses, even though the loudspeakers really do not radiate these low bass frequencies.

Although the present invention has been shown and described with respect to several preferred embodiments thereof, various changes, omissions and additions to the form and detail thereof, may be made therein, without departing from the spirit and scope of the invention.

What is claimed is:

1. A method for processing an audio signal, comprising the steps of:
    band-limiting the received audio signal to generate a first intermediate signal;
    multiplying the first intermediate signal by a correction factor to generate a second intermediate signal;
    amplifying the second intermediate signal by an amplification factor to generate a third intermediate signal;
    limiting the amplitude of the third intermediate signal to a threshold value to generate a fourth intermediate signal;
    providing the correction factor as a feedback signal that is a function of the third intermediate signal;
    band-limiting the fourth intermediate signal to generate a fifth intermediate signal; and
    adding the fifth intermediate signal to the received audio signal.

2. The method of claim 1, further comprising the step of:
    adjusting the correction factor based on whether the third intermediate signal exceeds a the threshold value.

3. The method of claim 2, where the step of adjusting the correction factor further comprises the step of:
    reducing the correction factor when the third intermediate signal exceeds the threshold value.

4. The method of claim 2, where the step of adjusting the correction factor further comprises the step of:
    increasing the correction factor when the third intermediate signal is less than the threshold value.

5. The method of claim 2, where the step of adjusting the correction factor further comprises the steps of:
    generating a control variable based on the amplitude of the third intermediate signal; and
    generating the correction factor as a function of the control variable.

6. The method of claim 5, where the step of generating the correction factor as a function of the control variable further comprises the step of low-pass filtering the control variable to generate the correction factor.

7. The method of claim 1, where the step of limiting the amplitude of the third intermediate signal to a threshold value comprises the steps of:
    generating harmonics of low-frequency signal components of the received audio signal; and
    weighting the harmonics with a variable factor.

8. The method of claim 7, where the step of weighting the harmonics with a variable factor further comprises the step of:
    generating the variable factor as a function of the third intermediate signal.

9. The method of claim 7, where the step of generating harmonics further comprises the step of:
    increasingly generating harmonics at the beginning of a low-frequency signal.

10. The method of claim 8, where the step of generating the variable factor as a function of the third intermediate signal further comprises the steps of:
    detecting a peak value of the third intermediate signal in accordance with a predetermined function of the third intermediate signal to generate a sixth intermediate signal;
    low-pass filtering the sixth intermediate signal separately with first and second time constants to generate first and second low-pass filtered signals; and
    generating a difference signal between the first and second low-pass filtered signals, where the difference signal is generated as the variable factor.

11. The method of claim 10, where the step of weighting further comprises the steps of:
    determining an absolute value of the third intermediate signal;
    multiplying the absolute value of the third intermediate signal with the variable factor to generate a seventh intermediate signal;

adding to the third intermediate signal to the seventh intermediate signal to form an eighth intermediate signal; and limiting amplitudes of the eighth intermediate signal to a specified value.

12. A circuit for processing an input audio signal received at an input of the circuit to provide at an output of the circuit a processed audio signal, the circuit comprising:

a first adder having first and second inputs and an output at which the processed audio signal is provided;

a first conductive path connecting the circuit input to the first input of the first adder, where the first conductive path is constructed and arranged to deliver the received audio signal unaltered to the first adder; and a second conductive path connecting the circuit input to the second input of the first adder, the second conductive path including, a first bandpass filter having an output and an input connected to the circuit input;

a multiplier having a first input connected to the first bandpass filter output, and a second input, and an output;

a variable amplifier, having an output and an input connected to the multiplier output, for amplifying a signal received at the amplifier input in accordance with an amplification factor presented at a control input of the amplifier;

a first nonlinear circuit having an output and an input connected to the amplifier output, the nonlinear circuit limiting the amplitude of the amplifier output to a threshold value;

a second bandpass filter having an input connected to the nonlinear circuit output and an output defining output of the second conductive path; and a first function generator having an input connected to a control output of the first nonlinear circuit, and an output connected to the second input of the multiplier, where the first function generator provides a feedback signal representative of a correction factor to the second input of the multiplier, and where the feedback signal is a function of a signal at the control output of the first nonlinear circuit.

13. The circuit of claim 12, where the first function generator comprises a first low-pass filter.

14. The circuit of claim 12, where the first nonlinear circuit further comprises:

a second nonlinear circuit having an input and output connected to the input and output, respectively, of the first nonlinear circuit, a control output defining the control output of the first nonlinear circuit, and a control input to which the second nonlinear circuit is responsive; and a second function generator having an input connected to the input of the first nonlinear circuit and an output connected to the control input of the second nonlinear circuit.

15. The circuit of claim 14, where the second function generator comprises:

a peak value detector circuit having an output and an input connected to the second function generator input;

a second low-pass filter having an output and an input connected to the peak value detector output;

a third low-pass filter having an output and an input connected to the peak value detector output;

a subtractor having first and second inputs connected to the outputs of the second and third low-pass filters, respectively, and an output; and a first limiter circuit having an input connected to the subtractor output, and an output connected to the control input of the second nonlinear circuit.

16. The circuit arrangement of claim 15, where the second nonlinear circuit comprises:

an absolute value forming circuit having an output and an input connected to the first nonlinear circuit input;

a second multiplier having a first input connected to the first limiter circuit output and a second input connected to the absolute value forming circuit output;

a second adder having an output, a first input connected to the first nonlinear circuit input, and a second input connected to the second multiplier output; and a second limiter circuit having an input connected to the second adder output, a control output connected to the first function generator, and an output connected to the second bandpass filter input.

17. A circuit for processing an input audio signal received at an input of the circuit to provide at an output of the circuit a processed audio signal, the circuit comprising:

means for band-limiting the received audio signal to generate a first intermediate signal;

means for multiplying the first intermediate signal by a correction factor to generate a second intermediate signal;

means for amplifying the second intermediate signal by an amplification factor to generate a third intermediate signal;

means for limiting the amplitude of the third intermediate signal to a threshold value to generate a fourth intermediate signal;

means for providing the correction factor as a feedback signal that is a function of the third intermediate signal;

means for band-limiting the fourth intermediate signal to generate a fifth intermediate signal; and means for adding the fifth intermediate signal to the received audio signal.

18. The circuit of claim 17, further comprising:

means for adjusting the correction factor based on whether the third intermediate signal exceeds a predetermined threshold value.

19. The circuit of claim 18, where the adjusting means comprises:

means for reducing the correction factor when the third intermediate signal exceeds the predetermined threshold value, and for increasing the correction factor when the third intermediate signal is less than the predetermined threshold value.

20. A circuit for processing an input audio signal received at an input of the circuit to provide at an output of the circuit a processed audio signal, the circuit comprising:

a first conductive path through which the received audio signal travels;

a second conductive path through which the received audio signal travels, where the audio signal is processed such that harmonics of the signal components with a low-frequency are generated in the second conductive path and are admixed to the signal in the first path, where in the second path the audio signal is sequentially bandpass filtered, weighted with a correction factor, amplified, limited to a threshold value, and bandpass filtered, where the correction factor is reduced when the threshold value is exceeded, and where the correction factor is provided as a feedback signal that is a function of the amplified audio signal.

* * * * *

UNITED STATES PATENT AND TRADEMARK OFFICE
CERTIFICATE OF CORRECTION

PATENT NO. : 7,317,800 B1
APPLICATION NO. : 10/030521
DATED : January 8, 2008
INVENTOR(S) : Vierthaler et al.

It is certified that error appears in the above-identified patent and that said Letters Patent is hereby corrected as shown below:

Column 8
Line 14, after "exceeds" delete "a"

Signed and Sealed this

Twenty-ninth Day of April, 2008

JON W. DUDAS
*Director of the United States Patent and Trademark Office*